(12) United States Patent
Fujita et al.

(10) Patent No.: US 6,306,183 B1
(45) Date of Patent: *Oct. 23, 2001

(54) METHOD OF FORMING MANUFACTURING SEMICONDUCTOR DEVICE

(75) Inventors: Shigeru Fujita, Kanagawa; Makoto Furuno, Tokyo; Hideharu Itatani, Toyama, all of (JP)

(73) Assignees: Sony Corporation; Hitachi Kokusai Electric, Inc., both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/043,989
(22) PCT Filed: Jul. 31, 1997
(86) PCT No.: PCT/JP97/02666
§ 371 Date: Mar. 30, 1998
§ 102(e) Date: Mar. 30, 1998
(87) PCT Pub. No.: WO98/05061
PCT Pub. Date: Feb. 5, 1998

(30) Foreign Application Priority Data

Jul. 31, 1996 (JP) .................................................. 8-201403

(51) Int. Cl.$^7$ ............................. H01L 21/00; H01L 21/64
(52) U.S. Cl. .......................................................... 29/25.01
(58) Field of Search ............................................ 29/25.01

(56) References Cited

U.S. PATENT DOCUMENTS 5,516,732 * 5/1996 Flegal .

FOREIGN PATENT DOCUMENTS

| 63-81933 | 4/1988 | (JP) . |
| 73936 | 10/1993 | (JP) . |
| 7-249672 | 9/1995 | (JP) . |

* cited by examiner

Primary Examiner—David E. Graybill
(74) Attorney, Agent, or Firm—Sonnenschein, Nath & Rosenthal

(57) ABSTRACT

A method of manufacturing a semiconductor device for use with a single wafer type reduced pressure CVD apparatus having a heat processing chamber 1 and a wafer carrier 2 arranged in the heat processing chamber 1 and including a plurality of upper and lower stages, in which wafers W are mounted on respective stages of the wafer carrier 2, and are subjected to film formations process while they are being heated. When wafers W are introduced into the heat processing chamber 1 previously heated to a desired heat processing temperature, wafers W to be mounted on stages except for at least the lowermost stage of the wafer carrier 2 are left in the heat processing chamber 1 until central portions of the wafers W are heated to the vicinity of the temperature within the heat processing chamber 1, without immediately mounting them on the respective stages. Thereafter, the wafers W are mounted on the predetermined stages of the wafer carrier 2 for carrying out the film formation processing.

2 Claims, 3 Drawing Sheets

US 6,306,183 B1

METHOD OF FORMING MANUFACTURING SEMICONDUCTOR DEVICE

FIELD OF THE INVENTION

This invention relates to a method of manufacturing a semiconductor device which has a film formation processing step using a single wafer type low pressure CVD (Chemical Vapor Deposition) apparatus capable of preventing foreign substance from being produced on a wafer.

BACKGROUND ART

Conventionally, a low pressure CVD apparatus has been widely utilized, particularly for forming a $Si_3N_4$ film, a polysilicon film, and so on, when a semiconductor device is manufactured.

Of the known low pressure CVD devices, a vertical batch type CVD apparatus is currently most popular. However, since wafers are expected to have increasingly larger diameters in future and a short TAT (Turn Around Time) is required for reducing a development term. A single wafer type CVD apparatus (for example, a single-wafer type reduced pressure CVD apparatus) has been developed for replacement of the vertical batch type CVD apparatus and has been gradually introduced into a portion of semiconductor device developing lines.

The single-wafer type reduced pressure CVD apparatus may be generally classified by two types of heating methods: a resistive heating hot wall type and a lamp heating cold wall type.

Within these classes, a single wafer type low pressure CVD apparatus of resistive heating hot wall type is similar to the conventional vertical type low pressure CVD apparatus in process conditions because the vertical low pressure apparatus also belongs to the resistive heating type, so that it can be readily replaced with the conventional apparatus. Moreover, since the resistive heating hot wall type has an additional feature of exhibiting a good temperature controllability, it is regarded as being advantageous over the lamp heating cold wall type.

As such a single wafer type reduced pressure CVD apparatus of resistive heating hot wall type, one capable of simultaneously processing two wafers, for example, silicon wafers for achieving higher through-put is also available partially in the market.

FIGS. 2A and 2B are a side view and a plan view showing an example of a heat processing chamber for a resistive heating hot wall type single-wafer type reduced pressure CVD apparatus, as mentioned above, which is capable of simultaneously processing two wafers.

This apparatus is provided with a heat processing chamber 1 serving as an reaction chamber for carrying out a film formation processing. A heater (not shown) is arranged outside the heat processing chamber in contact with a upper wall surface and a lower wall surface thereof which allow for adjustment to a desired film formation processing temperature. The heat processing chamber 1 is also provided inside thereof with a wafer carrier 2. The wafer carrier 2 is composed of an upper stage 2a and a lower stage 2b, as illustrated in FIG. 2A, each of the upper stage 2a and the lower stage 2b is constructed of legs 3 and a carrier plate 4. A circular opening 5, sufficiently larger than a wafer W as illustrated in FIG. 2B, is formed through each carrier plate 4 of the respective upper stage 2a and lower stage 2b, and a pin 6 protruding into the opening 5 is formed on the circumferential edge of the opening 5 at four diametrically opposing positions. These pins 6, which are made of a quartz boat and arranged below the top surface of the carrier plate 4, are formed such that the spacing between the opposing pins 6, 6 is smaller than the diameter of the wafer W to support the wafer W at their tip ends.

In order to subject the wafer W to film formation processing by using a low pressure CVD apparatus having the heat processing chamber 1 constructed as described above, conventionally, the heat processing chamber 1 is heated at first by the heaters to a film formation processing temperature. Then, two wafers W are carried on transporting arms (not shown), respectively which are then inserted into an accommodation port 7 of the heat processing chamber 1, and the wafers W are immediately mounted on the pins 6 of the upper stage 2a and on the pins 6 of the lower stage 2b, respectively, in a bridging style for achieving higher through-put.

Subsequently, when the wafer W is heated to the temperature within the heat processing chamber 1, i.e., the film formation processing temperature, a material gas is introduced into the inside of the heat processing chamber 1 from a material gas introducing tube, not shown, to perform the film formation processing.

In the film forming method as described above, however, when the temperature within the heat processing chamber 1 reaches 700–850° C., many particles of foreign substances are observed on the top surface, i.e., the film forming surface of the wafer W mounted on the lower stage 2b. The occurrence of such foreign substances causes a reduced yield.

The present invention has been made in view of the problem mentioned above, and its object is to provide a method of manufacturing a semiconductor device which prevents foreign substances from being produced on a wafer.

DISCLOSURE OF THE INVENTION

As a result of deep investigation into achieving the above-mentioned object, the inventors have reached a belief that the phenomenon of the aforementioned foreign substance is caused by wafers being rubbed with pins of quartz boats for supporting the wafers when the wafers are introduced into the heat processing chamber and mounted on the pins of respective stages of the wafer carrier.

More specifically, when a wafer is introduced into the heat processing chamber and mounted on the wafer carrier, the wafer is exposed to a high temperature within the heat processing chamber abruptly from the room temperature so that peripheral portions thereof, particularly those in contact with the pins, are first heated to exhibit thermal expansion, and subsequently a central portion thereof also gradually expands due to the heat. Thus, the wafer suffers from deformation (warping) due to a temporal deviation of the thermal expansion between the peripheral portion and the central portion thereof. As the deformation is developed, the pins of quartz boat and portions of the wafer in contact therewith are rubbed to cause foreign substances. Particularly, when this phenomenon occurs on the upper stage of the wafer carrier, produced foreign substances P drop onto the film formation surface of the wafer W mounted on the lower stage, as illustrated in FIG. 3, to cause the phenomenon that many foreign substances are produced on the film formation surface thereof, as described above.

Thus, to prevent such a phenomenon, in the present invention, when wafers are introduced into a heat processing chamber previously heated to a desired heat processing temperature, those wafers to be mounted on stages except for at least the lowermost stage of the wafer carrier, are left in the heat processing chamber until central portions thereof are heated to the vicinity of the temperature within the heat processing chamber, without immediately mounting them on the stages of the wafer carrier. Thereafter, the wafers are mounted on predetermined stages of the wafer carrier and are subjected to the film formation processing.

According to this manufacturing method, when wafers are introduced into the heat processing chamber with a transporting arm or the like, the wafers are left in the heat processing chamber until central portions of the wafers are heated to the vicinity of the temperature within the heat processing chamber, without immediately mounting the wafers on predetermined stages of the wafer carrier, and the wafers are thereafter mounted on the predetermined stages of the wafer carrier, so that deformation thereof due to thermal expansion occurs when the wafers are left in the heat processing chamber, held by the transporting arm or the like. Since the deformation has substantially disappeared when the wafers are mounted on the wafer carrier, the wafers are prevented from being rubbed with the wafer carrier with the deformation.

BEST MODE FOR CARRYING OUT THE INVENTION

A manufacturing method according to the present invention will hereinafter be described in detail based on an exemplary embodiment in which the method is applied to the formation of a $Si_3N_4$ film.

The exemplary embodiment differs from the aforementioned conventional film forming method in that when wafers are introduced into a heat processing chamber 1, they are temporarily left in the heat processing chamber 1 without being immediately mounted on the wafer carrier 1.

Figure 1:
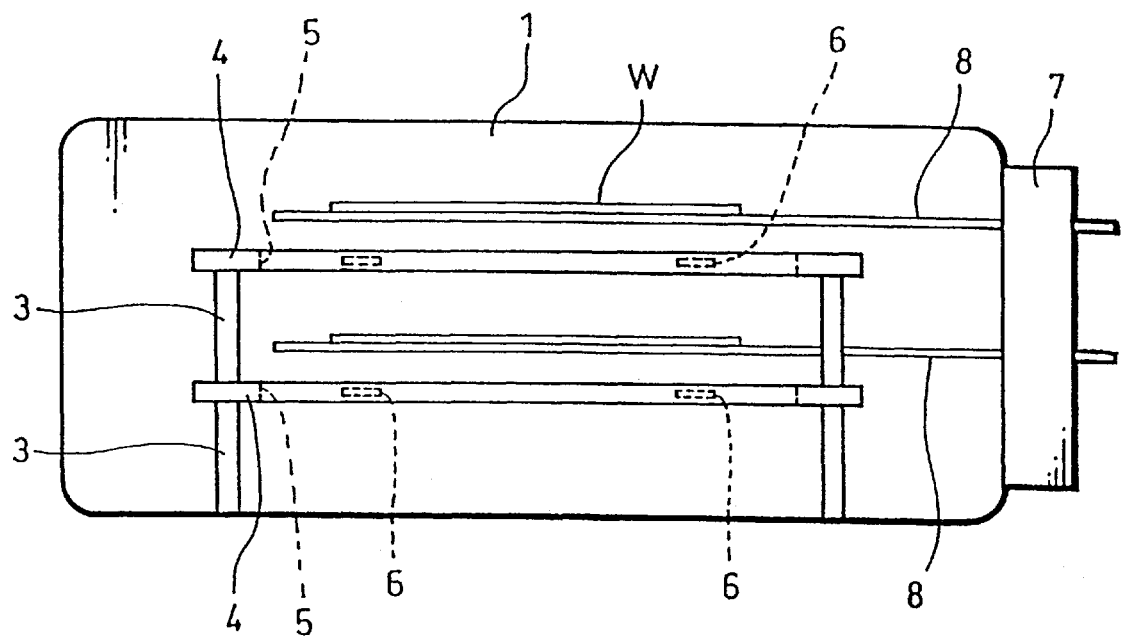
FIG. 1 is a diagram for explaining one exemplary embodiment of a manufacturing method according to the present invention.
Figure 2A:
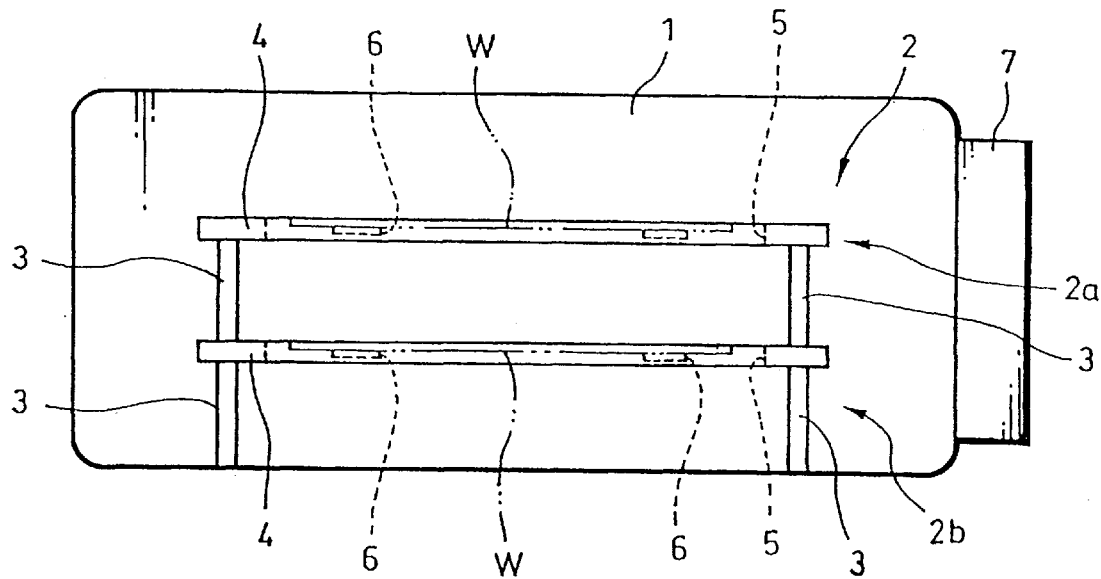
FIG. 2A is a side view illustrating a schematic structure of a heat processing chamber according to the present invention.
Figure 2B:
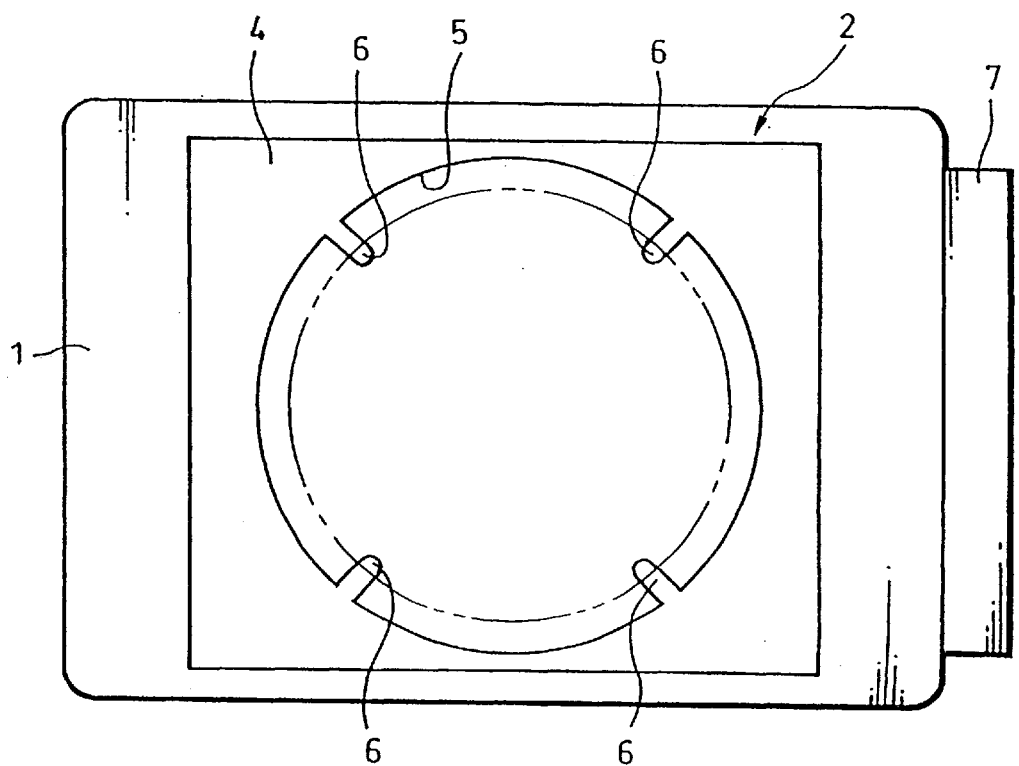
FIG. 2B is a plan view thereof.
Figure 3:
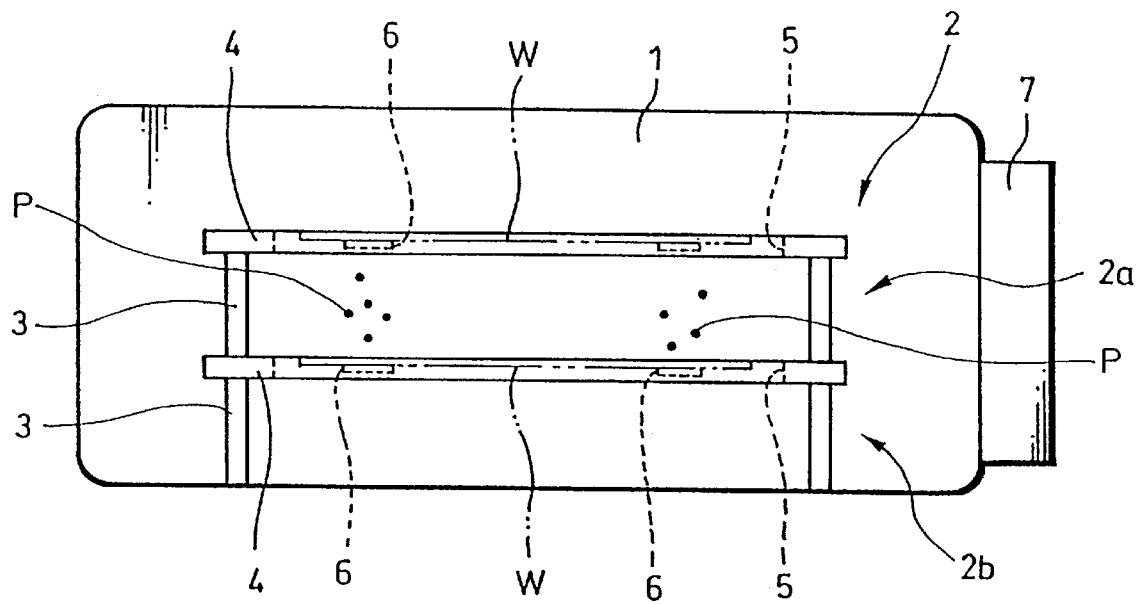
FIG. 3 is a diagram for explaining a problem of the prior art.

More specifically, in the present exemplary embodiment, when wafers W undergo the film formation processing using a single wafer type low pressure CVD apparatus, the heat processing chamber 1 is heated first by a heater to a film formation processing temperature, e.g., at 750° C. in this example in a manner similar to the prior art. Next, the wafers W are held by two transporting arms positioned one below the other, respectively, and the transporting arms 8, 8 are introduced into the heat processing chamber 1 in that state, as illustrated in FIG. 1.

Then, the wafers W,W are left in this state, i.e., respectively held by the transporting arms 8, 8 for a previously set predetermined time period, i.e., for a time period for which the wafers W at the room temperature should be left in the heat processing chamber 1 such that the temperature in central portions thereof becomes substantially equal to the temperature within the heat processing chamber 1 (film formation processing temperature). Here, the leaving time period may be previously determined by an experiment or the like, and is set approximately in a range of about two to four minutes in the exemplary embodiment.

When the wafers W, W are substantially heated to the temperature within the heat processing chamber 1 (film formation processing temperature) in the manner mentioned above, the transporting arms 8, 8 are lowered to mount the wafers W, W on pins 6 of an upper stage 2a and a lower stage 2b of a wafer carrier 2, respectively.

Then, after the transporting arms 8, 8 are withdrawn from the introducing accommodation port 7, the inside of the heat processing chamber 1 is decompressed to 60 Pa with a vacuum pump (not shown), and a material gas, $NH_3$ or $SiH_2Cl_2$ in this example, is introduced into the inside of the heat processing chamber 1 through a material gas introducing tube (not shown) at a flow rate of 200 sccm or at a flow rate of 20 sccm, respectively, to perform the film formation processing at a film formation rate of approximately 3 nm/min.

After a $Si_3N_4$ film of a desired thickness is thus formed, the material gas is exhausted from the inside of the heat processing chamber 1 with the vacuum pump, and thereafter the wafers W are withdrawn out from the in side of the heat processing chamber 1.

When the $Si_3N_4$ film on the wafer W withdrawn was observed, substantially no foreign substances were found, thus confirming that foreign substances were prevented from being produced.

In the manufacturing method as described above, when the wafers W, W are introduced into the heat processing chamber 1 by the transporting arms 8, 8, these wafers W, W are left in the heat processing chamber 1 until the temperature of central portions thereof becomes substantially equal to the temperature within the heat processing chamber, without being immediately mounted on the respective stages of the wafer carrier 2. Therefore, the wafers W can be prevented from deforming due to thermal expansion in a state where they are mounted on the wafer carrier 2, thereby making it possible to avoid such a phenomenon that the wafer W is rubbed with the pins 6 of the wafer carrier 2 due to the deformation, which would cause foreign particles that would drop onto the wafer W mounted on the lower stage 2b, and consequently many foreign substances are produced on the film formation surface of the wafer W.

While the foregoing exemplary embodiment has been described for the case where the present invention is applied to the formation of the $Si_3N_4$ film, the present invention is not limited to this but may be fully applicable to processes which can form a film using the reduced pressure CVD, for example, the present invention can be applied to the formation of a polysilicon film by changing the material gas species to $SiH_4$.

Also, in the foregoing exemplary embodiment, not only the wafer W to be mounted on the upper stage 2a but also the wafer W to be mounted on the lower stage 2b are left until their temperature reaches the temperature within the heat processing chamber 1. However, the wafer W may be immediately mounted on the lower stage 2b as before, while the wafer W to be mounted on the upper stage 2a may only be left.

Further, while the foregoing exemplary embodiment has been described in connection with an example which uses a two-stage wafer carrier having an upper stage and a lower stage, a wafer carrier having three or more stages may be used, in which case wafers which one mounted on stages except for at least the lowermost stage may be left within the heat processing chamber.

As described above, the method of manufacturing a semiconductor device according to the present invention leaves wafers in the heat processing chamber, when the wafers are introduced into the heat processing chamber with transporting arms or the like, until central portions of the wafers are heated to the vicinity of the temperature within the heat processing chamber, without immediately mounting the wafers on predetermined stages of the wafer carrier, and thereafter mounts the wafers on the predetermined stages of the wafer carrier, so that the wafers can be prevented from deforming due to thermal expansion in a state where they are mounted on the wafer carrier. It is therefore possible to prevent phenomena including the rubbing between the wafers and the wafer carrier caused by the deformation, the production of foreign substances due to the rubbing which would drop onto a wafer mounted on the lower stage, and many foreign substances consequently produced on the film formation surface of this wafer.

What is claimed is:

1. A method of manufacturing a semiconductor device, said method comprising the steps of:

providing a wafer processing chamber and preheating the chamber to a desired processing temperature;

mounting a semiconductor wafer on a transport arm outside of said chamber;

introducing said transport arm and wafer into said chamber;

allowing a central portion of said wafer to heat to about the desired processing temperature while held on said transport arm and before mounting said wafer on a wafer carrier stage; and thereafter mounting said wafer on a wafer carrier stage in said chamber.

2. In a method of manufacturing a semiconductor device for use with a single wafer type low pressure CVD apparatus having a heat processing chamber and a wafer carrier arranged within the heat processing chamber and including a upper and a lower stage, and having a process in which wafers are placed on respective stages of said wafer carrier, and said wafers are heated to be subjected to a film formation processing, said method of manufacturing a semiconductor device comprising the steps of:

heating said heat processing chamber to a predetermined heat processing temperature;

introducing at least one of said wafers in said heat processing chamber after said heat processing chamber has been heated to said predetermined heat processing temperature;

heating each of said wafers that are to be mounted on a stage until a central portion of said wafers are heated to said predetermined temperature, except for one of said wafers on the lower stage of the wafer carrier; and thereafter mounting each of said wafers on a predetermined stage of the wafer carrier for undergoing a film formation processing.

* * * * *